(12) United States Patent
Matsuda (10) Patent No.: US 11,270,967 B2
(45) Date of Patent: Mar. 8, 2022

(54) METHOD FOR MANUFACTURING SEMICONDUCTOR DEVICE AND SEMICONDUCTOR DEVICE

(71) Applicant: SUMITOMO ELECTRIC DEVICE INNOVATIONS, INC., Kanagawa (JP)

(72) Inventor: Keita Matsuda, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 80 days.

(21) Appl. No.: 16/800,843

(22) Filed: Feb. 25, 2020

(65) Prior Publication Data
US 2020/0279822 A1 Sep. 3, 2020

(30) Foreign Application Priority Data
Feb. 28, 2019 (JP) .............................. JP2019-035719

(51) Int. Cl.
*H01L 23/00* (2006.01)

(52) U.S. Cl.
CPC .............. *H01L 24/13* (2013.01); *H01L 24/03* (2013.01); *H01L 24/05* (2013.01); *H01L 24/11* (2013.01); *H01L 2224/0362* (2013.01); *H01L 2224/03464* (2013.01); *H01L 2224/03614* (2013.01); *H01L 2224/0401* (2013.01); *H01L 2224/05024* (2013.01); *H01L 2224/05082* (2013.01); *H01L 2224/05155* (2013.01); *H01L 2224/05164* (2013.01); *H01L 2224/05166* (2013.01); *H01L 2224/05171* (2013.01); *H01L 2224/10145* (2013.01); *H01L 2224/11849* (2013.01); *H01L 2224/13026* (2013.01); *H01L 2224/13111* (2013.01); *H01L 2224/13139* (2013.01); *H01L 2924/014* (2013.01); *H01L 2924/1033* (2013.01); *H01L 2924/10344* (2013.01); *H01L 2924/13064* (2013.01)

(58) Field of Classification Search
CPC ...................................................... H01L 24/13
See application file for complete search history.

(56) References Cited

U.S. PATENT DOCUMENTS

2001/0006455 A1* 7/2001 Fukunaga ............... H01L 24/13
361/760
2017/0365571 A1* 12/2017 Matsuda ................. H01L 24/05

FOREIGN PATENT DOCUMENTS

| JP | 2005-150578 | 6/2001 |
| JP | 2017-228583 | 12/2017 |

* cited by examiner

*Primary Examiner* — William A Harriston
(74) *Attorney, Agent, or Firm* — Smith, Gambrell & Russell, LLP.

(57) ABSTRACT

There is provided a method for manufacturing a semiconductor device comprising: forming a first organic insulating layer on a semiconductor region; forming a bump base film including an edge portion contacting with the first organic insulating layer; performing heat treatment of the bump base film; and forming a second organic insulating layer so as to cover the edge portion of the bump base film and the first organic insulating layer around the bump base film while contacting with the first organic insulating layer, the second organic insulating layer being provided with a first opening that exposes a surface of the bump base film.

16 Claims, 10 Drawing Sheets

METHOD FOR MANUFACTURING SEMICONDUCTOR DEVICE AND SEMICONDUCTOR DEVICE

CROSS-REFERENCE TO RELATED APPLICATIONS

This application is based upon and claims the benefit of priority from Japanese Patent Application No. 2019-035719, filed on Feb. 28, 2019, the entire contents of which are incorporated herein by reference.

TECHNICAL FIELD

The present disclosure relates to a method for manufacturing a semiconductor device and a semiconductor device.

BACKGROUND

JP2005-150578A and JP2017-228583A disclose technologies related to methods for manufacturing a semiconductor device. In the method disclosed in JP2005-150578A, a rewiring is formed of conductive films (a Ti film and a Pd film from the layer at the bottom) used as base films (under bump metal (UBM) films) of an Au bump. The Ti film and the Pd film are formed using a sputtering method. When resistance in a rewiring becomes a problem, an Au film is formed on the Pd film, thereby realizing a rewiring structure having the Ti film, the Pd film, and the Au film from the layer at the bottom.

The method disclosed in JP2017-228583A includes a step of forming a first metal layer, a step of forming a cover film, and a step of forming a second metal layer. In the step of forming the cover film, the cover film formed of any of Cu, Ti, Al, Mg, and Cr is formed in a region of an outer circumference of the first metal layer. In the step of forming the second metal layer, having the first metal layer as a seed metal, electroless plating treatment is performed with respect to a metal different from a material constituting the cover film and selected from Ni, Pd, and Al. The second metal layer is positioned on an upper surface of the first metal layer and does not extend to an outward side of the cover film.

SUMMARY

The present disclosure provides a method for manufacturing a semiconductor device. This method comprises: forming a first organic insulating layer on a semiconductor region; forming a bump base film including an edge portion contacting with the first organic insulating layer; performing heat treatment of the bump base film; and forming a second organic insulating layer so as to cover the edge portion of the bump base film and the first organic insulating layer around the bump base film while contacting with the first organic insulating layer. The second organic insulating layer is provided with a first opening that exposes a surface of the bump base film.

The present disclosure provides a semiconductor device. The semiconductor device comprises a semiconductor region, a first organic insulating layer, a bump base film, a second organic insulating layer, and a solder bump. The first organic insulating layer is provided on the semiconductor region. The bump base film includes an edge portion positioned on the first organic insulating layer. The second organic insulating layer is provided so as to cover the edge portion of the bump base film and the first organic insulating layer around the bump base film while contacting with the first organic insulating layer. The second organic insulating layer is provided with a first opening that exposes a surface of the bump base film. The solder bump covers the first opening and contacts with the bump base film.

DETAILED DESCRIPTION

[Problem to be Solved by the Present Disclosure]

A package of a ball grid array (BGA) can be used for performing flip-chip mounting of a semiconductor device on a substrate or the like. A solder bump is formed on a wiring layer of such a semiconductor device (for example, refer to JP2005-150578A JP2017-228583A). In order to curb mutual diffusion of a metal material between a solder and a wiring layer, a bump base film (UBM film) is provided between a wiring layer and a solder bump. For example, an organic insulating layer such as a polyimide film is provided on a semiconductor region as an interlayer film of the wiring layer.

Due to the difference between the coefficients of thermal expansion of an organic insulating material such as polyimide and a metal material, the bump base film may easily peel off from the organic insulating layer because of thermal stress or the like generated at the time of solder ball mounting. When a gap is generated between the bump base film and the organic insulating layer, a solder may infiltrate into the gap. If the solder infiltrates, a fracture is likely to occur on a boundary surface between the bump base film and the wiring layer, so that the reliability of the semiconductor device deteriorates.

[Effects of the Present Disclosure]

The present disclosure provides a method for manufacturing a semiconductor device and a semiconductor device, in which the reliability can be improved by reducing infiltration of a solder into a gap between a bump base film and an organic insulating layer.

DESCRIPTION OF EMBODIMENT OF PRESENT DISCLOSURE

Specific examples of the method for manufacturing a semiconductor device and the semiconductor device of the present disclosure will be described below with reference to the drawings. The present invention is not limited to these examples. The present invention is indicated by the claims, and it is intended to include all changes within meanings and a range equivalent to the claims. In the following description, the same reference signs are applied to the same elements in description of the drawings, and duplicate description will be omitted.

Figure 1:
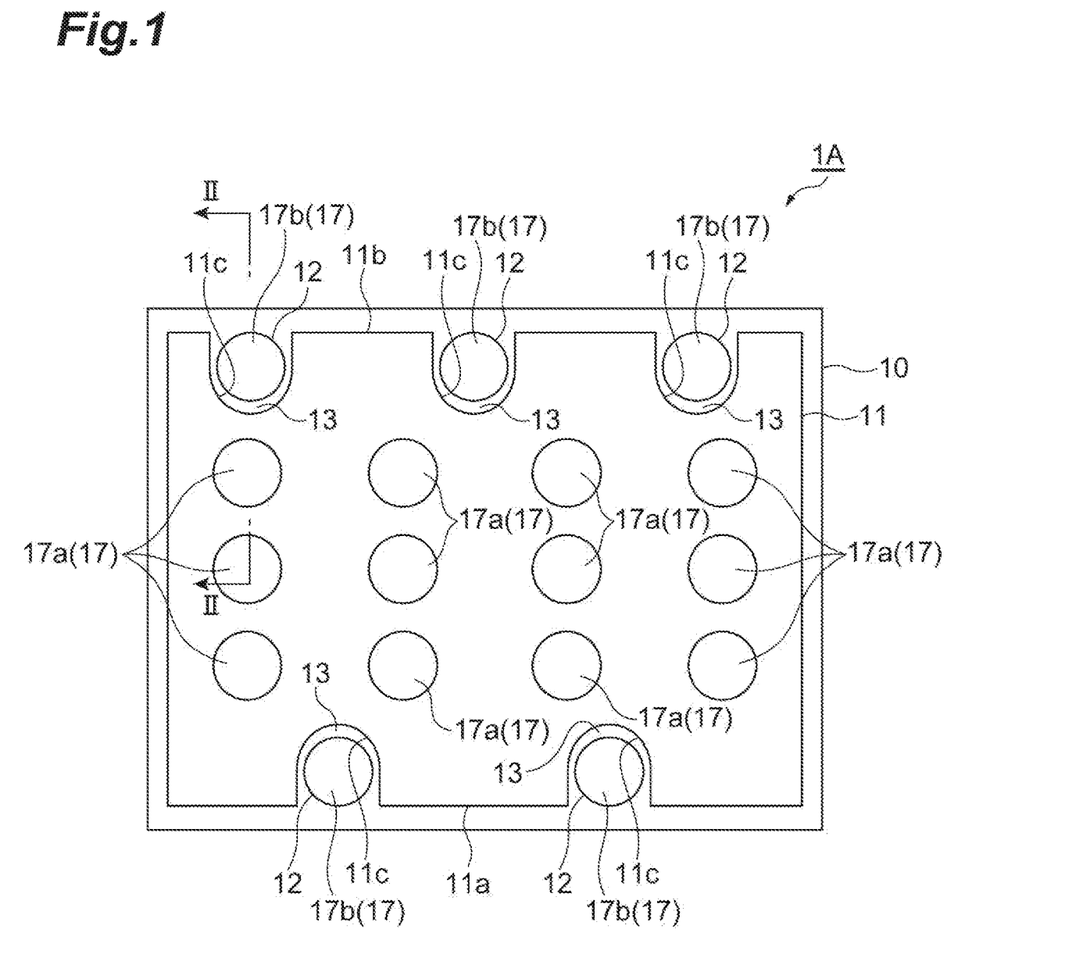
FIG. 1 is a plan view illustrating a semiconductor device according to an embodiment.

FIG. 1 is a plan view illustrating a semiconductor device 1A according to an embodiment. As illustrated in FIG. 1, the semiconductor device 1A, which is a BGA semiconductor device, comprises a semiconductor region 10 and a plurality of solder bumps 17 provided on a surface of the semiconductor region 10. The plurality of solder bumps 17 are disposed on the surface of the semiconductor region 10 in a planarly dispersed manner. For example, the solder bumps 17 are substantially spherical structures constituted of metals such as alloys of tin and silver (Sn—Ag).

For example, when the semiconductor device 1A is a high electron mobility transistor (HEMT) constituted of a gallium nitride (GaN)-based semiconductor, the semiconductor region 10 includes a GaN channel layer and an AlGaN barrier layer (or an InAlN barrier layer). The semiconductor region 10 may include a field effect transistor (FET) other than an HEMT or a semiconductor layer for a semiconductor functioning device other than those.

A ground wiring region 11 and signal wiring regions 12 are provided on the surface of the semiconductor region 10. The ground wiring region 11 is provided substantially throughout the entire surface of the semiconductor region 10. The planar shape of the ground wiring region 11 is substantially similar to the planar shape of the semiconductor device 1A and is a substantially rectangular shape, in an example. N (five in the example illustrated in FIG. 1) semicircular cutouts 11c are formed in a pair of side 11a and 11b of the ground wiring region 11 facing each other in a certain direction, and each of the signal wiring regions 12 is provided on the inward side of each of the cutouts 11c. The planar shape of each of the signal wiring regions 12 is a circular shape, for example. The ground wiring region 11 and each of the signal wiring regions 12 are isolated from each other, and semi-annular gap regions 13 are provided between the ground wiring region 11 and the signal wiring regions 12. In the example illustrated in FIG. 1, two signal wiring regions 12 are disposed side by side along one side 11a of the ground wiring region 11, and three signal wiring regions 12 are disposed side by side along the other side 11b of the ground wiring region 11.

The plurality of solder bumps 17 include M (12 in the example illustrated in FIG. 1) ground solder bumps 17a and N signal solder bumps 17b. The M ground solder bumps 17a are arranged in a two-dimensional shape in a row direction and a column direction orthogonal to each other in the ground wiring region 11. The N signal solder bumps 17b are respectively provided on the signal wiring regions 12. Some (two in the example illustrated in FIG. 1) of the N signal solder bumps 17b are arranged along the side 11a of the ground wiring region 11, and the others (three in the example illustrated in FIG. 1) are arranged along the side 11b of the ground wiring region 11.

Figure 2:
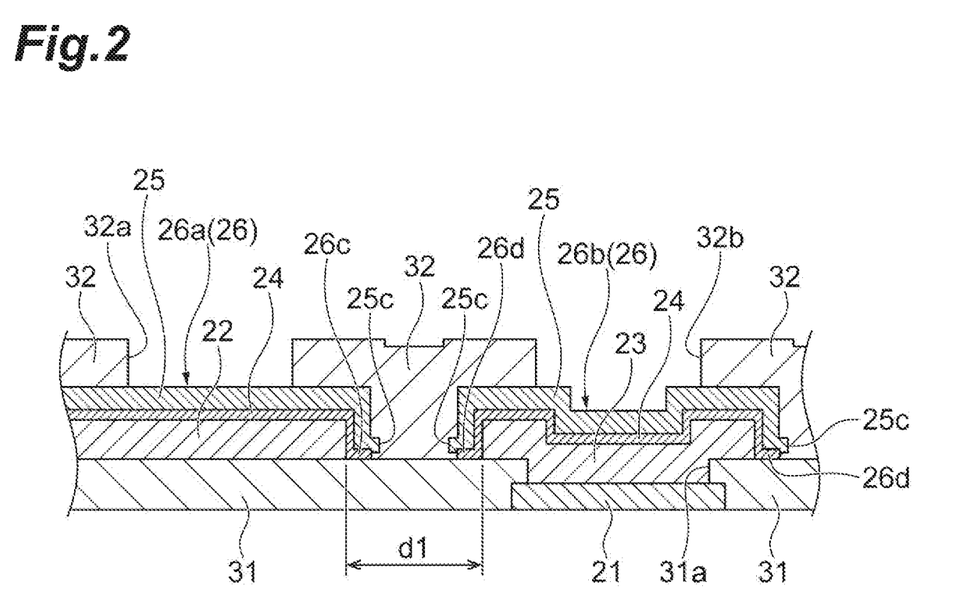
FIG. 2 is an enlarged view illustrating a cross section of a base structure of a solder bump along line II-II illustrated in FIG. 1.

FIG. 2 is an enlarged view illustrating a cross section of a base structure of the solder bump 17 along line II-II illustrated in FIG. 1. As illustrated in FIG. 2, the semiconductor device 1A includes metal wirings 21 provided on the surface of the semiconductor region 10 and an organic insulating layer 31 provided on the surface of the semiconductor region 10. Moreover, the semiconductor device 1A includes metal films 22 and 23, a bump base film 26, and an organic insulating layer 32. In FIG. 2, illustration of the semiconductor region 10 and the solder bumps 17 illustrated in FIG. 1 is omitted.

The metal wirings 21 are signal wirings provided on an inorganic insulating layer (for example, a SiN layer or a $SiO_2$ layer) on the semiconductor region 10. The metal wirings 21 are connected to electrodes (for example, a source electrode and a drain electrode) brought into ohmic contact with the semiconductor region 10, or an electrode (for example, a gate electrode) brought into Schottky contact with the semiconductor region 10. For example, the metal wirings 21 are constituted of a metal such as gold (Au). The thickness of each of the metal wirings 21 may be within a range of 0.5 μm to 3.0 μm and is 1 μm in an example.

The organic insulating layer 31 is an interlayer film of a dielectric substance provided between wiring layers. The organic insulating layer 31 is mainly formed of a resin and is formed of polyimide, in an example. The organic insulating layer 31 is provided throughout the entire surface of the semiconductor region 10 and covers the inorganic insulating layer and the metal wirings 21. The organic insulating layer 31 has openings 31a for exposing a part of the metal wirings 21 on the metal wirings 21. When viewed in a thickness direction of the semiconductor region 10, the openings 31a overlap the signal solder bumps 17b (refer to FIG. 1). The thickness of the organic insulating layer 31 may be within a range of 1 μm to 6 μm.

The metal film 22 functions as ground wirings. The metal films 23 function as signal wirings. The metal films 22 and 23 are provided on the organic insulating layer 31 and are formed of metals such as gold (Au), for example. The metal film 22 is provided on the ground wiring region 11 illustrated in FIG. 1, and the planar shape of the metal film 22 coincide with the planar shape of the ground wiring region 11. Specifically, the metal film 22 is provided substantially throughout the entire surface of the semiconductor region 10. The planar shape of the metal film 22 is substantially similar to the planar shape of the semiconductor device 1A and is substantially rectangular shape, in an example. In a pair of sides of the metal film 22 facing each other in a certain direction, semicircular cutouts corresponding to the cutouts 11c illustrated in FIG. 1 are formed, and each of the metal films 23 is provided on the inward side of each of the cutouts. Each of the metal films 23 is provided on each of the signal wiring regions 12 illustrated in FIG. 1, and the planar shape of each of the metal films 23 coincides with the planar shape of each of the signal wiring regions 12. The metal film 22 and the metal films 23 are separated from each other, and a distance dl between the metal film 22 and the metal films 23 is within a range of 50 μm to 300 μm, for example. The metal films 23 fill the openings 31a formed in the organic insulating layer 31, completely cover the openings 31a, and are connected to the metal wirings 21 through the openings 31a. The thickness of each of the metal films 22 and 23 may be within a range of 0.5 μm to 5.0 μm and is 2 μm, in an example.

The bump base film 26 is constituted to include a part 26a provided on the metal film 22 and covering the metal film 22, and parts 26b provided on the metal films 23 and covering the metal films 23. In the present embodiment, the part 26a covers an upper surface and a side surface of the metal film 22, and an edge portion 26c of the part 26a is positioned on the organic insulating layer 31 around the metal film 22 and comes into contact with the organic insulating layer 31. Each of the parts 26b covers an upper surface and a side surface of each of the metal films 23, and an edge portion 26d of each of the parts 26b is positioned on the organic insulating layer 31 around the metal film 23 and comes into contact with the organic insulating layer 31. The part 26a and the respective parts 26b are separated from each other with the gap region 13 (refer to FIG. 1) sandwiched therebetween.

The bump base film 26 is constituted mainly to include a seed metal film 24 and a main film 25 provided on the seed metal film 24. For example, the seed metal film 24 mainly includes metals such as titanium (Ti) and palladium (Pd). In an example, the seed metal film 24 includes Ti layers respectively provided on the metal films 22 and 23, and Pd layers provided on the Ti layers. In this case, the thickness of the Ti layer may be within a range of 5 nm to 100 nm and is 5 nm, in an example. The thickness of the Pd layer may be within a range of 10 nm to 500 nm and is 10 nm, in an example. The seed metal film 24 is used as a seed metal when the main film 25 is formed through electroless plating treatment. When the main film 25 includes Ni (or NiCr) and the metal wirings 21 include Au, the seed metal film 24 hinders Ni (or NiCr) and Au forming an alloy.

The main film 25 is a metal film provided on the seed metal film 24 and comes into contact with the seed metal film 24. For example, the main film 25 mainly includes a metal such as nickel (Ni) or a nickel-chrome alloy (NiCr). The main film 25 is provided to prevent mutual diffusion of a solder constituting the solder bump 17 and gold (Au) constituting the metal wirings 21. When the main film 25 is a Ni layer, for example, the thickness of the Ni layer is within a range of 3 μm to 6 μm. An edge portion 25c of the main film 25 protrudes from the seed metal film 24. The edge portion 25c may be provided with a gap in the thickness direction with respect to the organic insulating layer 31 or may come into contact with the organic insulating layer 31.

For example, the organic insulating layer 32 mainly includes a photosensitive resin. For example, the photosensitive resin is photosensitive polyimide. In an example, the organic insulating layer 32 is formed of the same material as the organic insulating layer 31. The organic insulating layer 32 is provided over at least from the edge portions 26c and 26d of the bump base film 26 to the organic insulating layer 31 around the bump base film 26 and comes into contact with the organic insulating layer 31. In the present embodiment, the organic insulating layer 32 is provided throughout the entire surface of the semiconductor region 10 and covers the organic insulating layer 31 exposed from the bump base film 26. The organic insulating layer 32 has openings 32a for exposing the part 26a of the bump base film 26 and openings 32b for exposing the parts 26b of the bump base film 26. When viewed in the thickness direction of the semiconductor region 10, the openings 32a overlap the ground solder bumps 17a (refer to FIG. 1) and the openings 32b overlap the signal solder bumps 17b (refer to FIG. 1). The ground solder bumps 17a cover the openings 32a and come into contact with the main film 25 of the part 26a of the bump base film 26 through the openings 32a. The signal solder bumps 17b cover the openings 32b and comes into contact with the main film 25 of the parts 26b of the bump base film 26 through the openings 32b. For example, the thickness of the organic insulating layer 32 is within a range of 1.0 μm to 10.0 μm.

Subsequently, the method for manufacturing the semiconductor device 1A described above will be described. First, the semiconductor region 10 is epitaxially grown on a substrate. For example, this is grown using a metal organic chemical vapor deposition (MOCVD) method. Next, electrodes (for example, a gate electrode, a source electrode, and a drain electrode) are formed on the semiconductor region 10. For example, the electrodes are formed by forming a resist mask having openings on the semiconductor region 10, performing vapor deposition of a metal which becomes an electrode material inside the openings of the resist mask and on the resist mask, and removing the metal on the resist mask together with the resist mask (that is, performing lifting off). Subsequently, an inorganic insulating layer (for example, a SiN layer) is formed on the semiconductor region 10. The inorganic insulating layer can be formed by a plasma CVD method, for example.

Figure 3A:
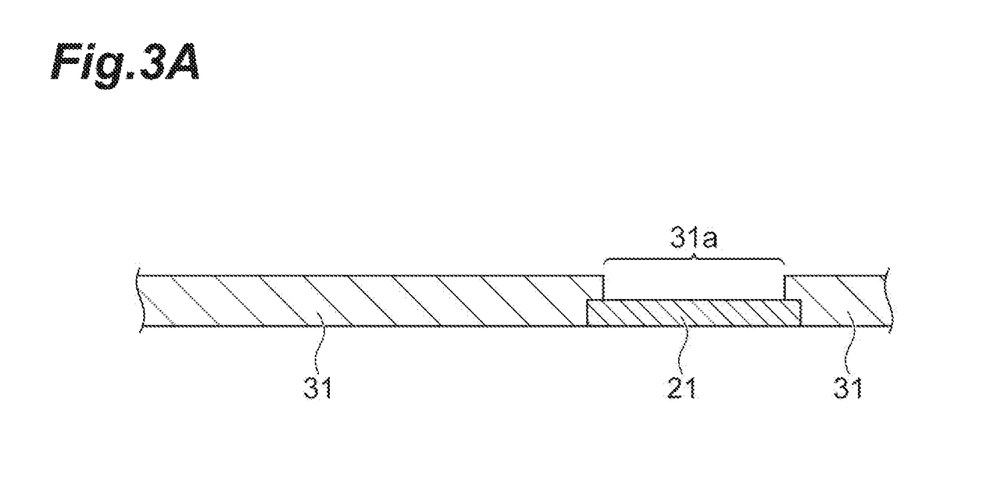
FIGS. 3A, 3B, and 3C are cross-sectional views illustrating each of steps in a method for manufacturing the semiconductor device illustrated in FIG. 1.

FIGS. 3A to 3C, 4A to 4C, and 5A and 5B are cross-sectional views illustrating each of steps after formation of the inorganic insulating layer in the method for manufacturing the semiconductor device 1A. Subsequent to the foregoing steps, as illustrated in FIG. 3A, the metal wirings 21 each having a predetermined planar pattern are formed on the inorganic insulating layer by an electro-plating method, for example. At this time, the metal wirings 21 and the electrodes are connected to each other via the openings formed in the inorganic insulating layer interposed therebetween.

Subsequently, the organic insulating layer 31 is formed on the surface of the semiconductor region 10 on which the metal wirings 21 are provided. For example, the organic insulating layer 31 is formed by performing spin coating of a material (for example, polyimide) of the organic insulating layer 31 on the semiconductor region 10. Further, the openings 31a are formed to expose the metal wirings 21 by forming a mask having opening patterns corresponding to the openings 31a on the organic insulating layer 31 and etching the organic insulating layer 31 with this mask interposed therebetween. For example, a material of the mask is SiN or $SiO_2$. The openings of the mask are formed using a photolithography technology or an electron beam lithography technology, for example. The openings 31a can be formed by dry etching using plasma.

Figure 3B:
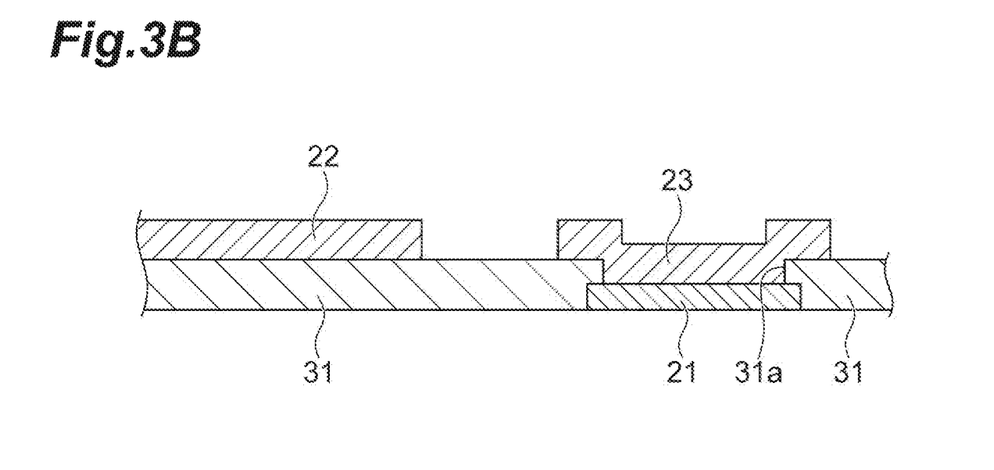

Subsequently, as illustrated in FIG. 3B, the metal films 22 and 23 each having a predetermined planar pattern are formed on the organic insulating layer 31 by an electro-plating method, for example. In this step, the metal film 22 is formed in the ground wiring region 11 illustrated in FIG. 1, and each of the metal films 23 is formed in each of the signal wiring regions 12. At this time, the metal films 23 are connected to the metal wirings 21 with the openings 31a of the organic insulating layer 31 interposed therebetween.

Figure 3C:
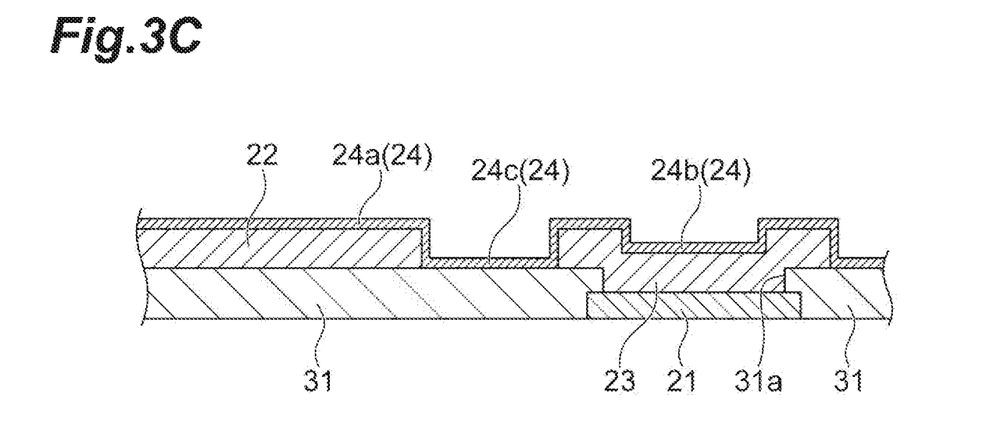

Subsequently, as illustrated in FIG. 3C, the seed metal film 24 is formed on the entire surface of the semiconductor region 10, and the upper surface and the side surface of the metal film 22, the upper surface and the side surface of each of the metal films 23, and a surface of the organic insulating layer 31 exposed from the metal films 22 and 23 are covered by the seed metal film 24. The seed metal film 24 is formed by a sputtering method, for example. In an example, a Ti layer having a thickness of 5 nm is formed by the sputtering method. Thereafter, a Pd layer having a thickness of 10 nm is formed on the Ti layer by the sputtering method. The seed metal film 24 formed in this manner includes a part 24a covering the metal film 22, parts 24b covering the metal films 23, and a part 24c positioned on the organic insulating layer 31.

Figure 4A:
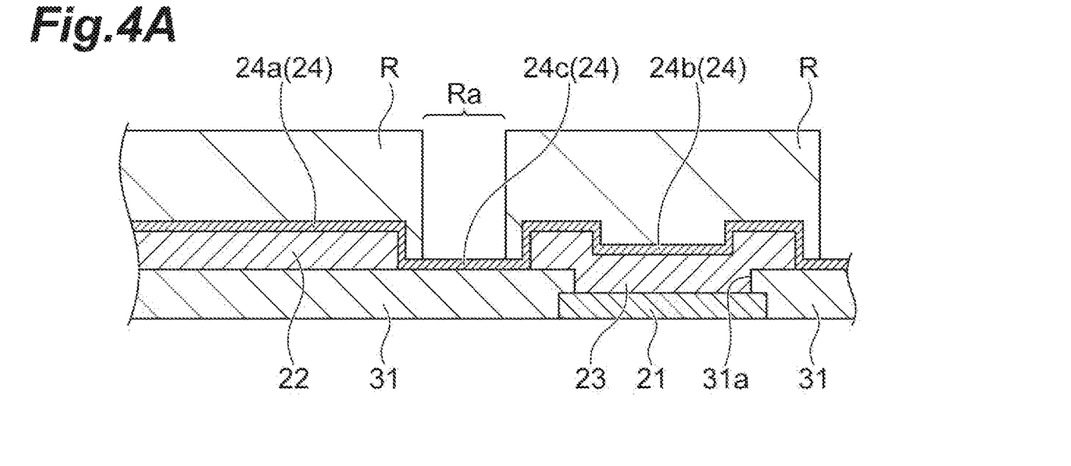
FIGS. 4A, 4B, and 4C are cross-sectional views illustrating each of the steps in the method for manufacturing the semiconductor device.

Subsequently, as illustrated in FIG. 4A, a photoresist R is formed on the seed metal film 24. The photoresist R has an opening Ra on the part 24c and exposes only the part 24c through the opening Ra. The photoresist R is a negative resist, for example. In such a case, the negative resist is applied on the seed metal film 24 and other regions excluding the region corresponding to the opening Ra are subjected to exposure and development, so that only the region corresponding to the opening Ra which has not been subjected to exposure can be removed. The photoresist R covers the parts 24a and 24b of the seed metal film 24 and covers a part of the part 24c adjacent to a circumferential edge portion of each of the parts 24a and 24b. Further, the part 24c of the seed metal film 24 exposed from the opening Ra of the photoresist R is removed through etching. Etching is wet etching, for example, using an iodine etchant (product name "AURUM" series, manufactured by KANTO CHEMICAL CO., INC.) or dry etching such as reactive ion etching (RIE). Accordingly, the part 24a and the part 24b of the seed metal film 24 are separated from each other. An edge portion of the seed metal film 24 which is positioned on the organic insulating layer 31 and comes into contact with the organic insulating layer 31 remains around the parts 24a and 24b. Thereafter, the photoresist R is removed.

Figure 4B:
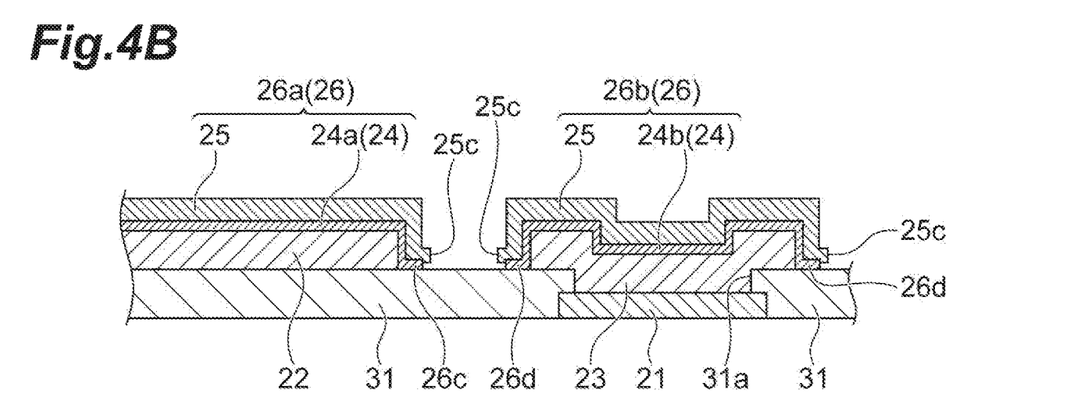

Subsequently, as illustrated in FIG. 4B, the parts 26a and 26b of the bump base film 26 are formed by forming the main film 25 on the seed metal film 24. In this step, the main film 25 is formed by an electroless plating method for causing the seed metal film 24 to be a seed metal. For example, the main film 25 is formed by electroless plating treatment (for example, autocatalysis electroless plating treatment) having hypophosphite for autocatalysis plating as a catalyst. The reason for using electroless plating is that it has more excellent reliability than electro-plating. Since the seed metal film 24 is provided restrictedly in the parts 24a and 24b, this electroless plating becomes selective plating, so that the main film 25 grows restrictedly on the part 24a and on the part 24b. Since the main film 25 also grows in a transverse direction, the edge portions 25c protruding from the seed metal film 24 are formed in the main film 25.

Electroless plating is a method for performing plating without using an external power source, and there are substitution plating using an ionization tendency, autocatalysis electroless plating (reduction plating) using a reductant, substitution reduction plating in which these are combined, and the like. Here, autocatalysis electroless plating is used, but other types of electroless plating may be used. On the other hand, electro-plating is a method for performing plating in which electrons are applied from a cathode by causing a current to flow between the electrodes using an external power source.

Subsequently, a Au film is formed on the main film 25. The Au film is formed using electroless plating treatment, electro-plating treatment, a vapor deposition-lifting off method, or a sputtering method for example. The thickness of the Au film is 10 μm, for example.

Figure 4C:
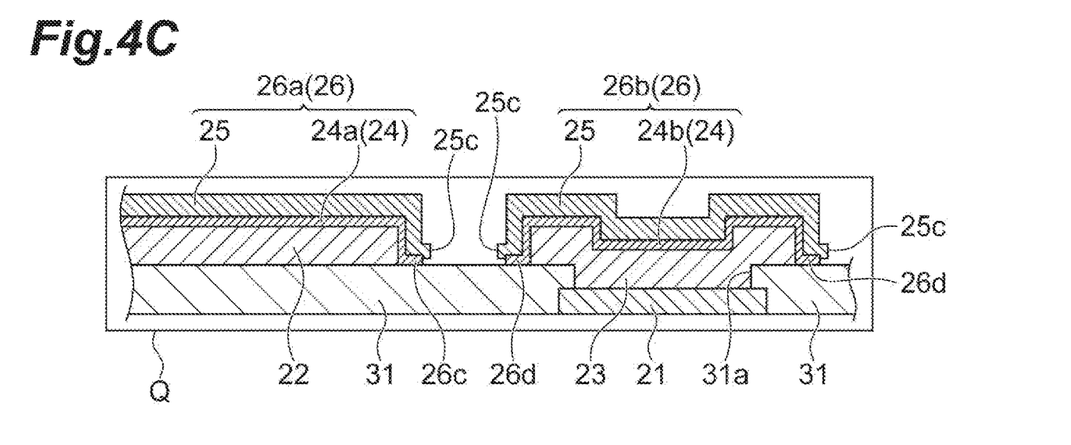

Subsequently, as illustrated in FIG. 4C, a product including the bump base film 26 is installed inside a heat treatment furnace Q, and heat treatment of the bump base film 26 is performed. A heat treatment temperature is a temperature higher than a reflow temperature of the solder bumps 17 formed in a constitution thereafter and is within a range of 260° C. to 350° C., for example. A heat treatment time may be within a range of 5 minutes to 60 minutes and is 30 minutes, in an example. For example, an atmosphere for heat treatment is atmospheric air (mixed atmosphere of nitrogen ($N_2$) and oxygen ($O_2$)), a vacuum atmosphere, or an inert gas atmosphere of argon (Ar) or helium (He).

Figure 5A:
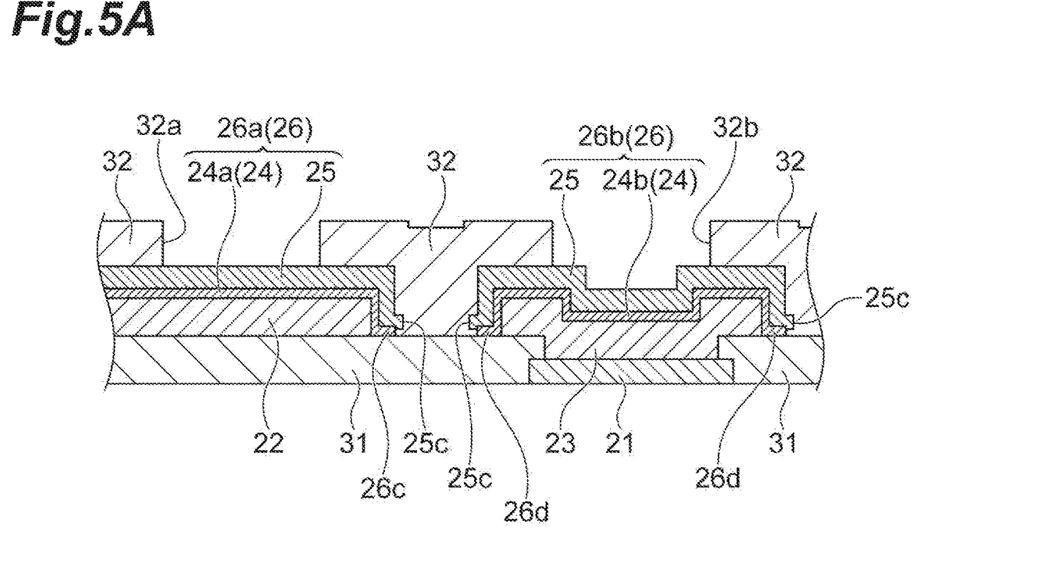
FIGS. 5A and 5B are cross-sectional views illustrating each of the steps in the method for manufacturing the semiconductor device.

Subsequently, as illustrated in FIG. 5A, the organic insulating layer 32 is formed on the surface of the semiconductor region 10 on which the bump base film 26 is formed. As described above, the organic insulating layer 32 is provided over at least from the edge portions 26c and 26d of the bump base film 26 to the organic insulating layer 31 around the bump base film 26 and comes into contact with the organic insulating layer 31. Similar to the organic insulating layer 31, for example, the organic insulating layer 32 is formed by performing spin coating of a material (for example, photosensitive polyimide) of the organic insulating layer 32 on the bump base film 26 and on the organic insulating layer 31 exposed from the bump base film 26. Further, the organic insulating layer 32 is subjected to exposure and development using a photomask having the opening patterns corresponding to the openings 32a and 32b, so that the openings 32a and 32b are formed and surfaces of the parts 26a and 26b of the bump base film 26 are exposed.

Figure 5B:
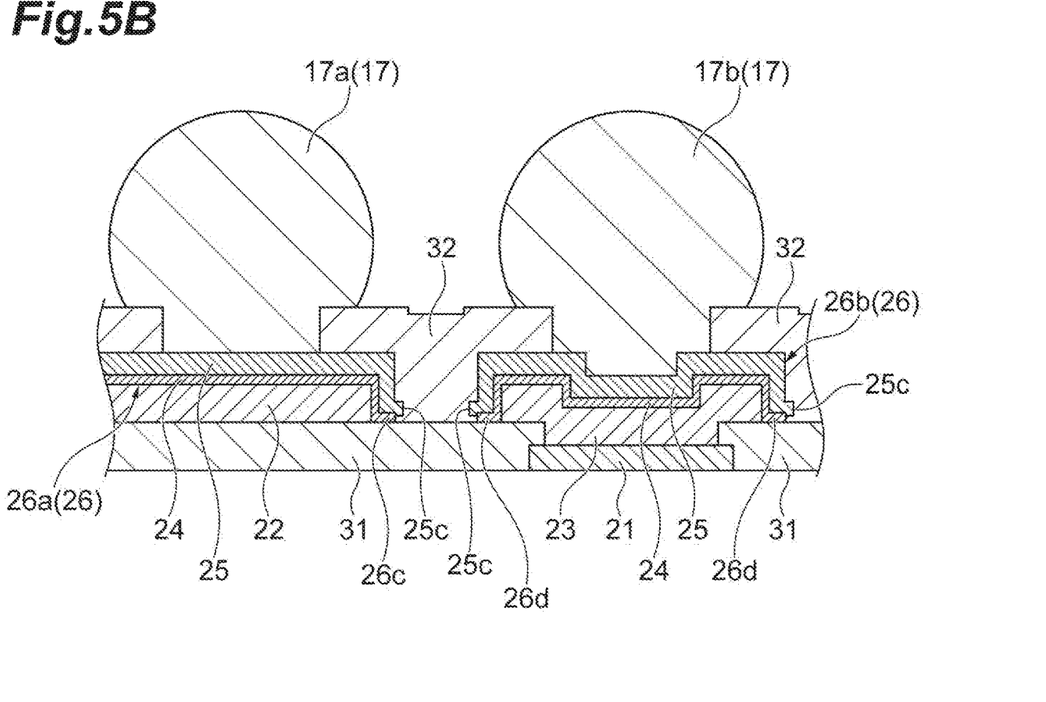

Subsequently, as illustrated in FIG. 5B, the solder bumps 17 are formed. That is, the ground solder bumps 17a covering the openings 32a and coining into contact with the part 26a of the bump base film 26, and the signal solder bumps 17b covering the openings 32b and coining into contact with the parts 26b of the bump base film 26 are formed. In this step, after a flux is applied, the solder bumps 17 having sizes such as a diameter of 160 pin, for example, are formed by a reflow (that is, heat treatment) at a temperature of 250° C., for example. The Au film formed on the seed metal film 24 is diffused substantially inside the solder bumps 17 in this step. Thereafter, the flux is cleaned. Through the foregoing steps, the semiconductor device 1A of the present embodiment illustrated in FIGS. 1 and 2 is produced.

Figure 10A:
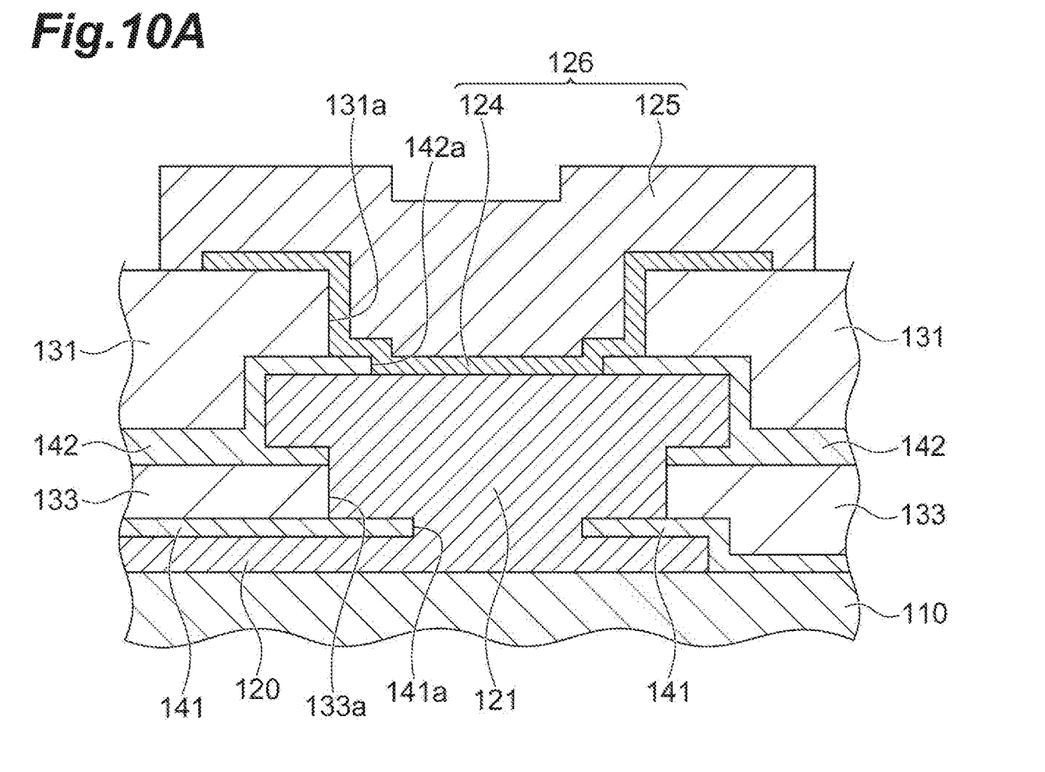
FIG. 10A is an enlarged cross-sectional view illustrating a part of a structure of a comparative example of the semiconductor device disclosed in JP2017-228583A.

Effects achieved by the method for manufacturing the semiconductor device 1A according to the present embodiment described above will be described together with problems of manufacturing methods in the related art. FIG. 10A is an enlarged cross-sectional view illustrating a part of a structure of a comparative example of the semiconductor device disclosed in JP2017-228583A. A metal wiring 120 constituted of Au, for example, is provided on a semiconductor region 110 mainly including a nitride semiconductor, and the metal wiring 120 is covered by an inorganic insulating layer 141 protecting the semiconductor region 110. For example, the inorganic insulating layer 141 is a silicon compound film of SiN or the like. An organic insulating layer 133 formed of a resin such as polyimide, for example, is provided on the inorganic insulating layer 141. Openings 141a and 133a penetrating the inorganic insulating layer 141 and the organic insulating layer 133 in the thickness direction are formed therein, and these openings 141a and 133a are filled with a metal wiring 121 constituted of Au, for example. The metal wiring 121 is connected to the metal wiring 120 through the openings 141a and 133a. An inorganic insulating layer 142 and an organic insulating layer 131 are laminated on the organic insulating layer 133. For example, the inorganic insulating layer 142 is a silicon compound film of SiN or the like. The organic insulating layer 131 is formed of a resin such as polyimide. Openings 142a and 131a of the inorganic insulating layer 142 and the organic insulating layer 131 are formed on the metal wiring 121, and a seed metal film 124 is provided on the side surface of each of the openings 142a and 131a and on a surface of the metal wiring 121 exposed from the openings 142a and 131a. The seed metal film 124 is constituted of Ti and Pd, for example. A main film 125 in which the seed metal film 124 is plating-formed as a seed metal is provided on the seed metal film 124. The main film 125 is constituted of Ni and Au, for example. The seed metal film 124 and the main film 125 constitute a bump base film 126. A circumferential edge portion of the bump base film 126 comes into contact with a surface of the organic insulating layer 131. A solder bumps is formed on the bump base film 126.

Figure 10B:
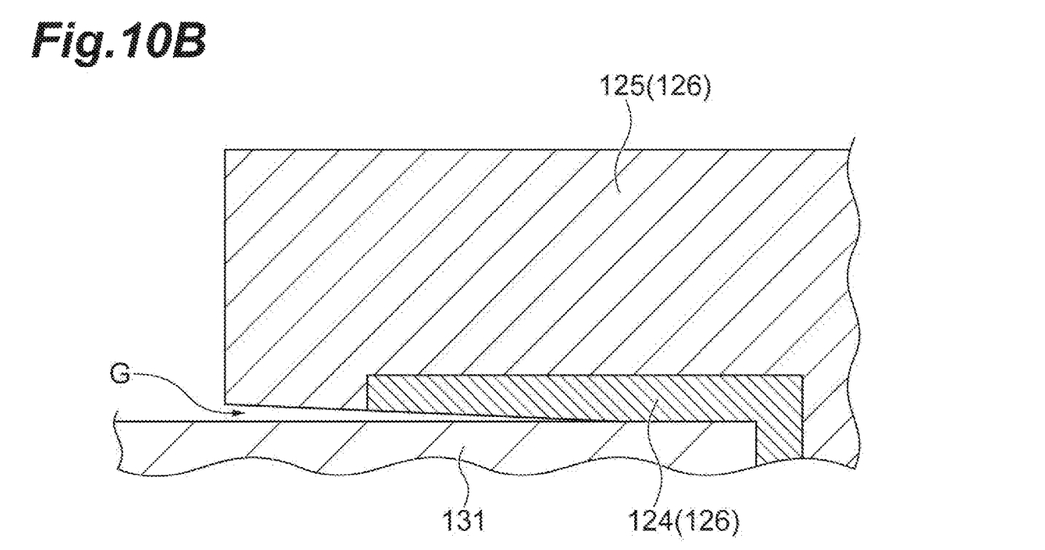
FIG. 10B is an enlarged cross-sectional view illustrating a part in FIG. 10A.

When the solder bump is formed through a reflow in the above structure, or when the above semiconductor device after forming the solder bump is mounted on a wiring substrate through a reflow, there are cases where the circumferential edge portion of the bump base film 126 peels off from the organic insulating layer 131 due to the difference between the coefficients of thermal expansion of an organic insulating material such as polyimide and a metal material, as illustrated in FIG. 10B. When a gap G is generated between the bump base film 126 and the organic insulating layer 131, a solder may infiltrate into this gap G and this solder may fracture a boundary surface between the bump base film 126 and the metal wiring 121.

In respect to this problem, the method for manufacturing the semiconductor device 1A of the present embodiment includes a step of forming the organic insulating layer 31 on the semiconductor region 10, a step of forming the bump base film 26, a step of performing heat treatment of the bump base film 26, and a step of forming the organic insulating layer 32. In the step of forming the bump base film 26, the bump base film 26 including the edge portions 26c and 26d positioned on the organic insulating layer 31 is formed. In the step of forming the organic insulating layer 32, the organic insulating layer 32 provided over at least from the edge portions 26c and 26d of the bump base film 26 to the organic insulating layer 31 around the bump base film 26, coining into contact with the organic insulating layer 31, and having the openings 32a and 32b for exposing a surface of the bump base film 26, is formed.

The semiconductor device 1A of the present embodiment includes the semiconductor region 10, the organic insulating layer 31 provided on the semiconductor region 10, the bump base film 26 including the edge portions 26c and 26d positioned on the organic insulating layer 31, the organic insulating layer 32, and the solder bumps 17 coining into contact with the bump base film 26. The organic insulating layer 32 is provided over at least from the edge portions 26c and 26d of the bump base film 26 to the organic insulating layer 31 around the bump base film 26 and comes into contact with the organic insulating layer 31. The organic insulating layer 32 has the openings 32a and 32b for exposing the surface of the bump base film 26. The ground solder bumps 17a cover the openings 32a and comes into contact with the bump base film 26, and the signal solder bumps 17b cover the openings 32b and comes into contact with the bump base film 26.

Figure 6:
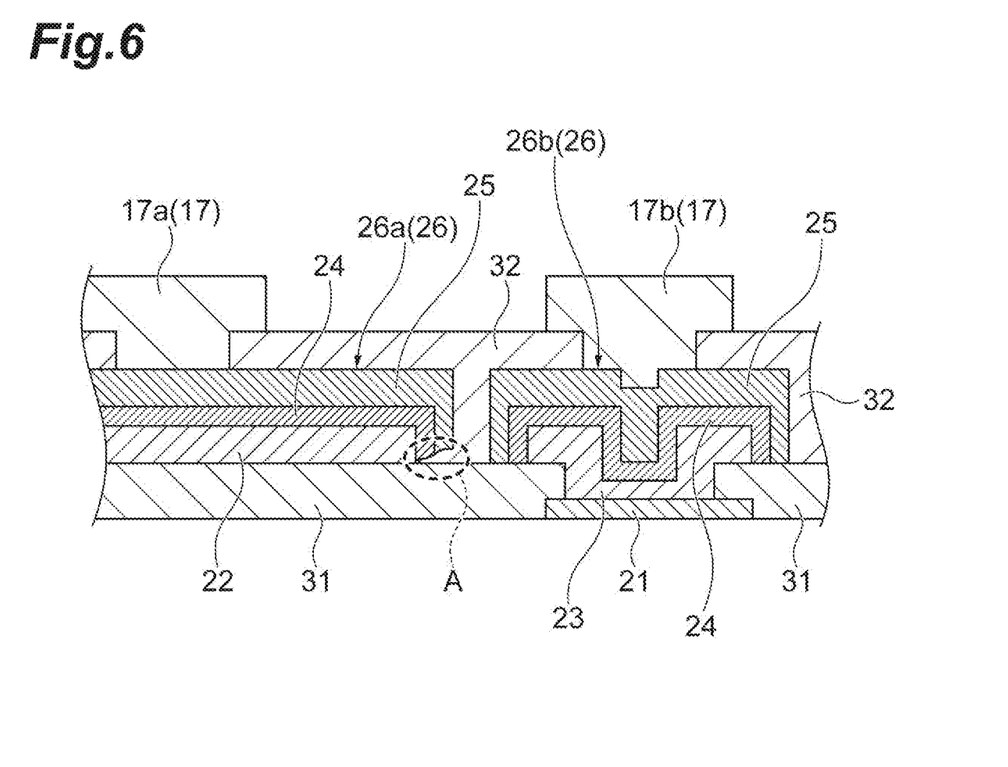
FIG. 6 is a view for describing an effect achieved by the semiconductor device and the method for manufacturing the semiconductor device according to the embodiment.

FIG. 6 is a view for describing an effect achieved by the semiconductor device 1A and the method for manufacturing the semiconductor device according to the present embodiment. In the present embodiment, heat treatment of the bump base film 26 is performed after the bump base film 26 is formed. At this time, the bump base film 26 peels off from the organic insulating layer 31 (part A in FIG. 6) in a part in which a joining strength between the bump base film 26 and the organic insulating layer 31 is low, due to stress caused by the difference between the coefficients of thermal expansion. When the bump base film 26 and the exposed organic insulating layer 31 are covered by the organic insulating layer 32 in a step thereafter, a material of the organic insulating layer 32 enters a gap between the bump base film 26 and the organic insulating layer 31.

In this manner, the present embodiment peels off the part in which the joining strength between the bump base film 26 and the organic insulating layer 31 is low in advance before a reflow of the solder bumps 17. The gap generated as a result thereof is filled with the material of the organic insulating layer 32 in advance. Accordingly, internal stress of the bump base film 26 is released, and generation of the gap between the bump base film 26 and the organic insulating layer 31 due to heat during a reflow of the solder bumps 17 can be reduced. Thus, infiltration of the solder into the gap between the bump base film 26 and the organic insulating layer 31 is reduced, so that the reliability of the semiconductor device 1A can be improved.

In the present embodiment, the organic insulating layer 32 may mainly include a photosensitive resin, and the step of forming the organic insulating layer 32 may include a step of forming the openings 32a and 32b by performing exposure and development of the organic insulating layer 32. Regarding the organic insulating layer 32, the openings 32a and 32b are generally formed through etching. However, when a photosensitive resin is used, the openings 32a and 32b are formed in the step of exposure and development, so that an etching step can be omitted.

In the present embodiment, the method for manufacturing the semiconductor device 1A may include a step of forming the solder bumps 17 by a reflow process to cover the openings 32a and 32b and come into contact with the bump base film 26. As described above, according to the manufacturing method of the present embodiment, generation of the gap between the bump base film 26 and the organic insulating layer 31 due to heat during the reflow process of the solder bumps 17 can be reduced. Thus, the reliability of the semiconductor device 1A when the solder bumps 17 is subjected to form by the reflow process can be improved.

In the present embodiment, in the heat treatment step of the bump base film 26, the heat treatment may be performed at a temperature higher than the reflow temperature of the solder bumps 17. Accordingly, a place where peeling of the bump base film 26 and the organic insulating layer 31 can occur at the reflow temperature of the solder bumps 17 can be reliably peeled off before a reflow. Thus, the reliability of the semiconductor device 1A can be further improved.

In the present embodiment, the metal films 22 and 23 in their entirety may be covered by the bump base film 26. Accordingly, the area of the bump base film 26 increases, and contact between the solder and the metal films 22 and 23 can be further reduced.

Modification Example

Figure 7:
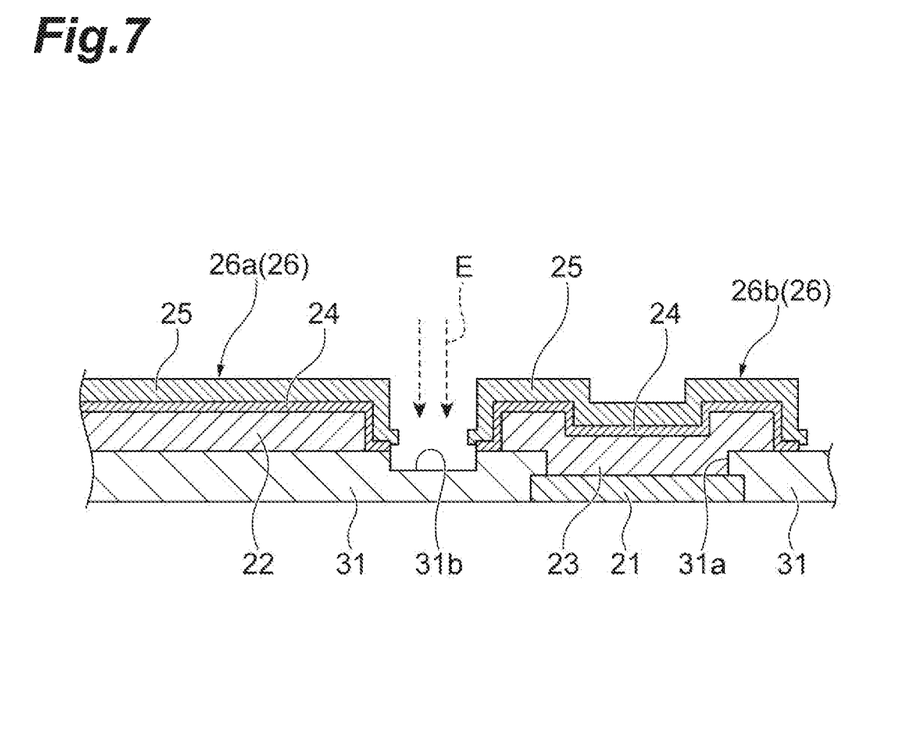
FIG. 7 is a cross-sectional view illustrating a step according to a modification example.
Figure 8:
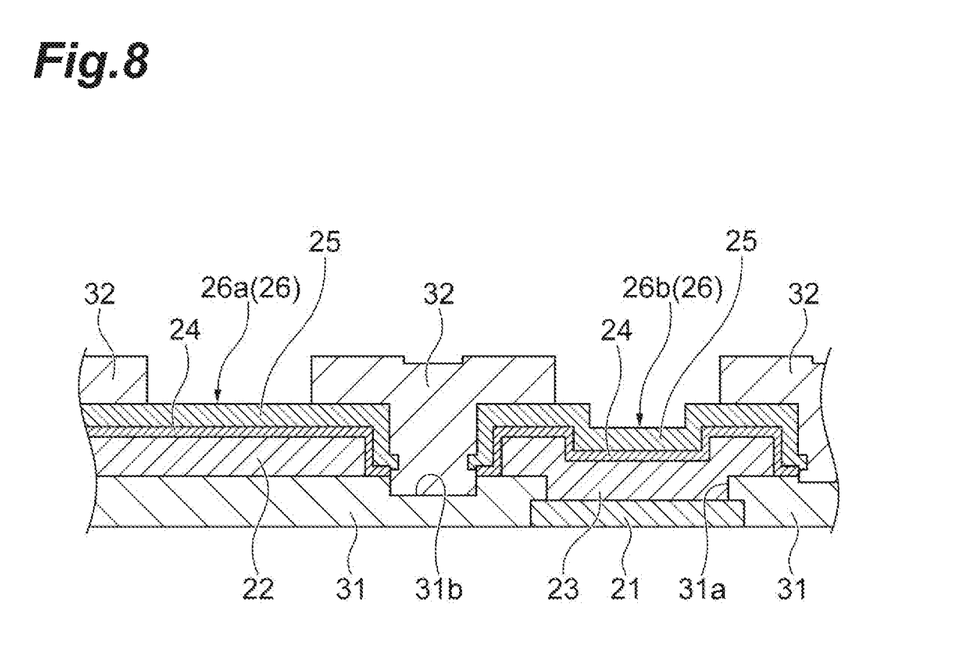
FIG. 8 is a cross-sectional view illustrating a state where an organic insulating layer is formed in the modification example.

FIG. 7 is a cross-sectional view illustrating a step according to a modification example of the foregoing embodiment. This step is performed after the heat treatment of the bump base film 26 illustrated in FIG. 4C is performed and before the organic insulating layer 32 illustrated in FIG. 5A is formed. In this step, a part of the organic insulating layer 31 exposed from the bump base film 26 is etched (arrow E in FIG. 7) to form a recessed portion 31b depressed from the surface of the organic insulating layer 31 in the part. The etching is reactive ion etching (RIE) using $O_2$ plasma, for example. The depth of the recessed portion 31b from the surface of the organic insulating layer 31 may be half or smaller than the thickness of the organic insulating layer 31. For example, when the thickness of the organic insulating layer 31 is 2 µm, the depth of the recessed portion 31b is 1 µm or smaller. FIG. 8 is a cross-sectional view illustrating a state where the organic insulating layer 32 is formed after the foregoing step. As illustrated in FIG. 8, the organic insulating layer 32 fills the recessed portion 31b.

Figure 9A:
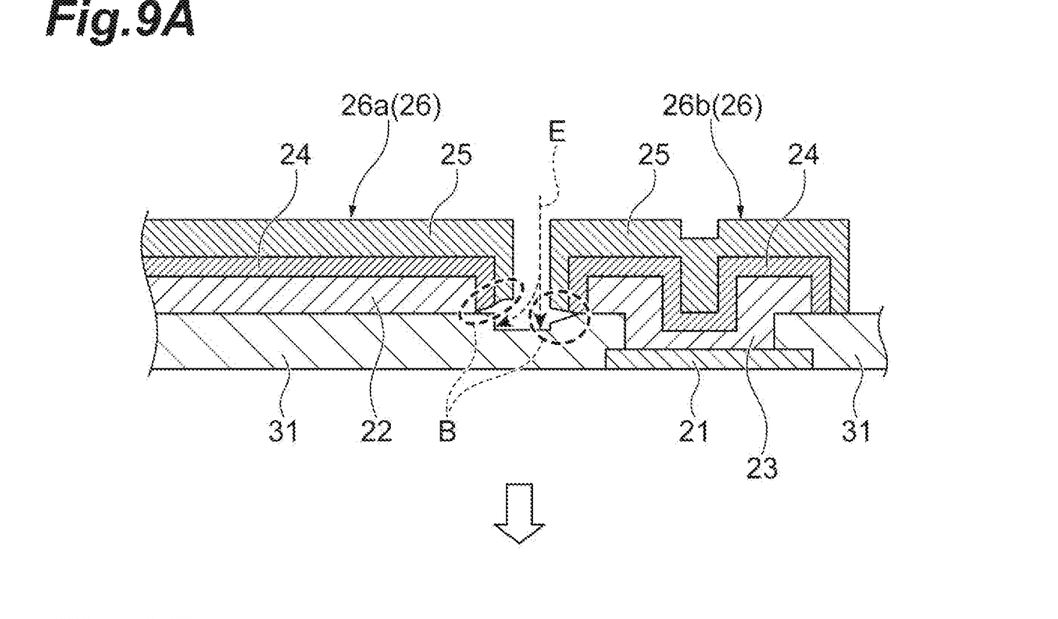
FIGS. 9A and 9B are views for describing an effect achieved by a manufacturing method according to the modification example.
Figure 9B:
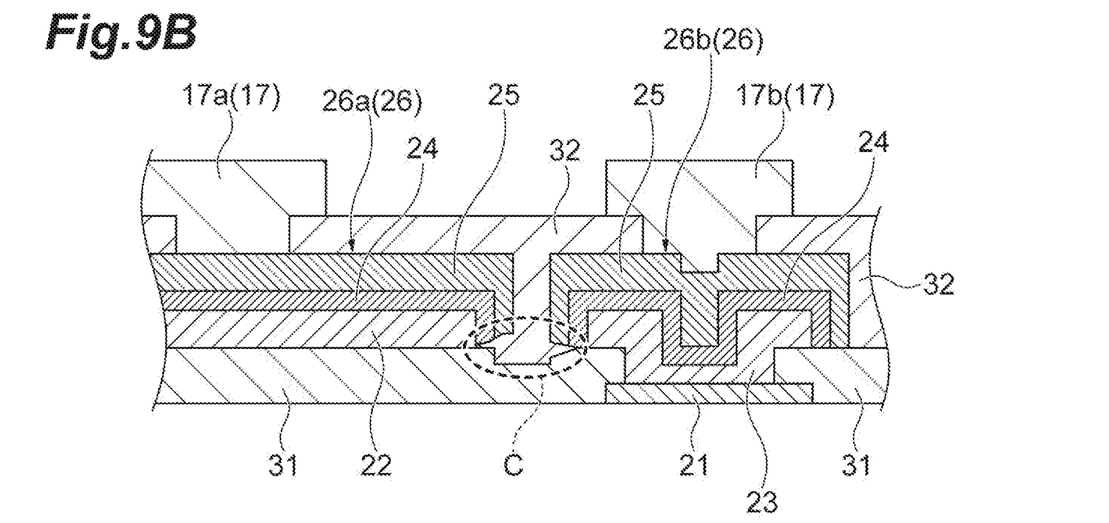

When the heat treatment of the bump base film 26 is performed and a minute gap is generated between the bump base film 26 and the organic insulating layer 31, depending on the size of the gap, there is concern that a constituent material of the organic insulating layer 32 may not enter the gap due to the viscosity of the constituent material. In such a case, if the organic insulating layer 31 is etched as in the present modification example, the gap between the bump base film 26 and the organic insulating layer 31 can be expanded as illustrated in a part B in FIG. 9A. Further, as illustrated in a part C in FIG. 9B, when the organic insulating layer 32 is formed, the constituent material of the organic insulating layer 32 easily enters the gap. Thus, the gap can be easily filled with the constituent material of the organic insulating layer 32, so that infiltration of the solder into the gap can be more effectively reduced, and the reliability of the semiconductor device 1A can be further improved.

The method for manufacturing a semiconductor device and the semiconductor device of the present disclosure are not limited to the embodiment described above, and various other modifications can be performed. For example, in the foregoing embodiment, an HEMT has been described as an example of a semiconductor region. However, the present disclosure is not limited to an HEMT, and can be applied to various semiconductor devices including a metal wiring and a solder bump.

What is claimed is:

1. A method for manufacturing a semiconductor device comprising:
   forming a first organic insulating layer on a semiconductor region;
   forming a bump base film including an edge portion contacting with the first organic insulating layer;
   performing heat treatment of the bump base film;
   forming a second organic insulating layer so as to cover the edge portion of the bump base film and the first organic insulating layer around the bump base film while contacting with the first organic insulating layer, the second organic insulating layer being provided with an opening that exposes a surface of the bump base film; and
   etching the first organic insulating layer after the performing of the heat treatment and before the forming of the second organic insulating layer.

2. The method for manufacturing a semiconductor device according to claim 1, wherein a recessed portion depressed from a surface of the first organic insulating layer is formed by the etching of the first organic insulating layer.

3. The method for manufacturing a semiconductor device according to claim 2, wherein a depth of the recessed portion from the surface of the first organic insulating layer is half or smaller than a thickness of the first organic insulating layer.

4. The method for manufacturing a semiconductor device according to claim 1, wherein the forming of the second organic insulating layer includes forming the opening by exposing and developing the second organic insulating layer that mainly includes a photosensitive resin.

5. The method for manufacturing a semiconductor device according to claim 1, further comprising:
   forming a solder bump by a reflow process so as to cover the first opening and contact with the bump base film.

6. The method for manufacturing a semiconductor device according to claim 5, wherein the heat treatment is performed at a temperature higher than a temperature of the reflow process of the solder bump.

7. The method for manufacturing a semiconductor device according to claim 5, wherein the heat treatment is performed at a temperature of a range of 260° C. to 350° C.

8. The method for manufacturing a semiconductor device according to claim 1, wherein the heat treatment of the bump base film continues within a range of 5 minutes to 60 minutes.

9. The method for manufacturing a semiconductor device according to claim 1, wherein the heat treatment of the bump base film is performed in atmospheric air, a vacuum atmosphere, or an inert gas atmosphere.

10. The method for manufacturing a semiconductor device according to claim 1, further comprising:
    forming a metal wiring serving as a signal wiring on the semiconductor region,
    wherein the first organic insulating layer is formed so as to have an opening that exposes a surface of the metal wiring in the forming of the first organic insulating layer.

11. The method for manufacturing a semiconductor device according to claim 10, further comprising:
    forming a first metal film serving as a ground wiring in a ground wiring region on the first organic insulating layer; and
    forming a second metal film serving as the signal wiring in a signal wiring region isolated from the ground wiring region so as to connect with the metal wiring through the opening of the first organic insulating layer.

12. The method for manufacturing a semiconductor device according to claim 11, wherein a first part of the bump base film covering the first metal film and a second part of the bump base film covering the second metal film are formed separately in the forming of the bump base film.

13. The method for manufacturing a semiconductor device according to claim 11, wherein the first metal film and the second metal film in their entirety are covered by the bump base film in the forming of the bump base film.

14. A semiconductor device comprising:
    a semiconductor region;
    a first organic insulating layer provided on the semiconductor region;
    a bump base film including an edge portion positioned on the first organic insulating layer;
    a second organic insulating layer provided so as to cover the edge portion of the bump base film and the first organic insulating layer around the bump base film while contacting with the first organic insulating layer, the second organic insulating layer being provided with an opening that exposes a surface of the bump base film;
    a solder bump covering the opening of the second organic insulating layer and contacting with the bump base film; and
    a metal wiring serving as a signal wiring provided on the semiconductor region,
    wherein the first organic insulating layer has an opening that exposes the metal wiring therefrom.

15. The semiconductor device according to claim 14, further comprising:

a first metal film serving as a ground wiring provided in a ground wiring region on the first organic insulating layer: and a second metal film serving as the signal wiring provided in a signal wiring region isolated from the ground wiring region and connected to the metal wiring through the opening in the first organic insulating layer.

16. The semiconductor device according to claim 15, wherein the bump base film includes a first part covering the first metal film, and a second part separated from the first part and covering the second metal film.

* * * * *